(12) United States Patent
Cho et al.

(10) Patent No.: US 7,339,242 B2
(45) Date of Patent: Mar. 4, 2008

(54) NAND-TYPE FLASH MEMORY DEVICES AND FABRICATION METHODS THEREOF

(75) Inventors: Seong-Soon Cho, Gyeonggi-do (KR); Keon-Soo Kim, Gyeonggi-do (KR); Jeong-Hyuk Choi, Gyeonggi-do (KR); Sang-Youn Jo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/360,112

(22) Filed: Feb. 22, 2006

(65) Prior Publication Data

US 2006/0186485 A1   Aug. 24, 2006

(30) Foreign Application Priority Data

Feb. 23, 2005   (KR)  ............... 10-2005-0015142

(51) Int. Cl.
    *H01L 29/76* (2006.01)
(52) U.S. Cl. ............... 257/401; 257/315; 257/286; 257/197; 257/284; 257/368
(58) Field of Classification Search ............ 257/284, 257/286, 197, 401, 368
    See application file for complete search history.

(56) References Cited

U.S. PATENT DOCUMENTS

| | | | | |
|---|---|---|---|---|
| 4,671,851 A | * | 6/1987 | Beyer et al. | 438/426 |
| 6,362,049 B1 | * | 3/2002 | Cagnina et al. | 438/258 |
| 6,376,876 B1 | * | 4/2002 | Shin et al. | 257/315 |
| 6,404,023 B1 | * | 6/2002 | Mori et al. | 257/393 |
| 6,790,729 B1 | | 9/2004 | Woo | |
| 7,122,426 B2 | * | 10/2006 | Lee et al. | 438/257 |
| 2001/0017800 A1 | * | 8/2001 | Lee | 365/200 |
| 2003/0151084 A1 | * | 8/2003 | Lee et al. | 257/315 |
| 2004/0157392 A1 | * | 8/2004 | Hao et al. | 438/253 |

(Continued)

FOREIGN PATENT DOCUMENTS

KR   2001-0075735   8/2001

(Continued)

OTHER PUBLICATIONS

English language abstract of Korean Publication No. 2001-0075735.

(Continued)

*Primary Examiner*—Jerome Jackson
*Assistant Examiner*—Jami M Valentine
(74) *Attorney, Agent, or Firm*—Marger Johnson & McCollom, P.C.

(57) ABSTRACT

In an embodiment, a memory device includes a semiconductor substrate having cell active regions and a peripheral active region. Plugs, including bit line contact plugs, a common source line, a peripheral gate interconnection contact plug, and peripheral metal interconnection contact plugs are formed of the same conductive layer through the same process. Also, metal interconnections including bit lines, a cell metal interconnection, a peripheral gate interconnection, and peripheral metal interconnections directly connected to the plugs may be formed of the same metal layer through the same process. Accordingly, the interconnection structure such as the plugs and the metal interconnections is simplified and thus the process of their formation is simplified.

19 Claims, 19 Drawing Sheets

U.S. PATENT DOCUMENTS

2004/0227173 A1* 11/2004 Ahn et al. .................. 257/296

FOREIGN PATENT DOCUMENTS

| KR | 2004-0063350 | 7/2004 |
| KR | 2004-0076300 | 9/2004 |

OTHER PUBLICATIONS

English language abstract of Korean Publication No. 2004-0063350.

English language abstract of Korean Publication No. 2004-0076300.

* cited by examiner

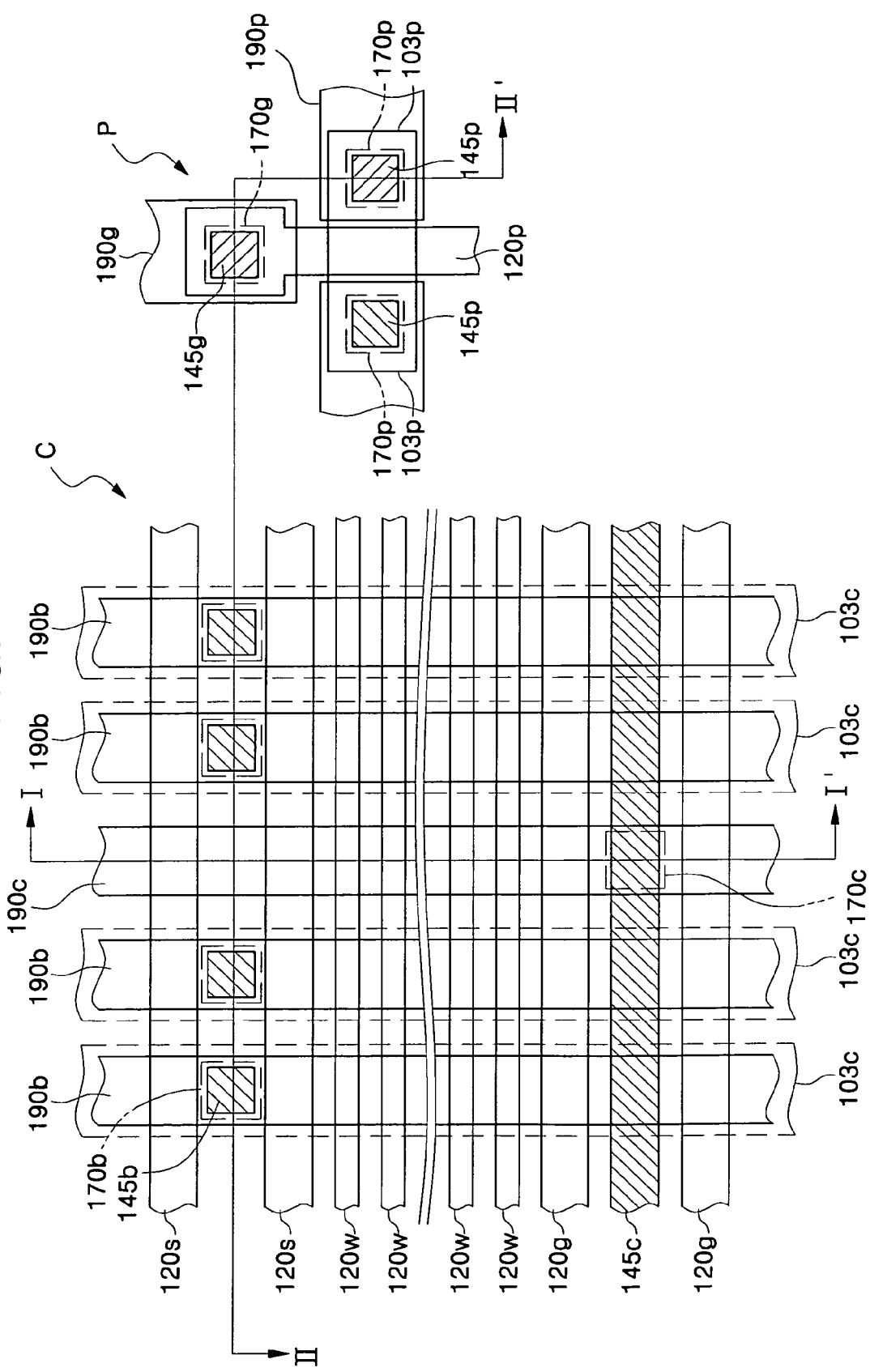

NAND-TYPE FLASH MEMORY DEVICES AND FABRICATION METHODS THEREOF

BACKGROUND OF THE INVENTION

This application claims priority from Korean Patent Application No. 2005-0015142, filed on Feb. 23, 2005, in the Korean Intellectual Property Office, the disclosure of which is incorporated herein by reference in its entirety.

1. Field of the Invention

The present invention relates to semiconductor devices and fabrication methods thereof, and more particularly, to NAND-type flash memory devices and fabrication methods thereof.

2. Description of the Related Art

In general, information stored in a non-volatile memory device, such as a flash memory device, is retained even if its power supply is cut off. Because of this advantage, the flash memory device is popular and widely used in a memory card, as well as other applications. Generally, the flash memory device can be classified into NAND-type flash memory devices and NOR-type flash memory devices. Among the architecture of these flash memory devices, a cell array region of a NAND-type flash memory device includes a plurality of transistor circuit strings. Each of these strings generally includes a string selection transistor, cell transistors, and a ground selection transistor, which are connected to each other in series. A drain region of the string selection transistor may be electrically connected to a bit line through a bit line contact plug, and a source region of the ground selection transistor may be electrically connected to a common source line (CSL).

A method of fabricating a NAND-type flash memory device is disclosed in U.S. Pat. No. 6,790,729 entitled "Method of manufacturing NAND flash memory device", by Woo. According to U.S. Pat. No. 6,790,729, an interlayer insulating layer on a semiconductor substrate is patterned to form a common source line contact hole, and a conductive layer fills the common source line contact hole to form a common source line (CSL). An insulating layer is formed on the entire surface of the semiconductor substrate having the common source line. Subsequently, the insulating layer is subjected to a damascene process to form a plurality of damascene patterns. The damascene patterns expose a predetermined region and a cell drain region of the common source line as well as a gate and a source/drain region of a peripheral transistor. Subsequently, a process of filling a metal layer in the damascene patterns is performed to form a metal interconnection connected to the common source line, a bit line connected to the cell drain region, and metal interconnections connected to the gate and the source/drain region of the peripheral transistor. According to this patent, the number of fabricating processes can be reduced compared with the conventional method of fabricating the NAND-type flash memory device. However, the NAND-type memory device according to U.S. Pat. No. 6,790,729 has a structure that may make it difficult to simplify its fabricating process.

Processes of forming fine and intricate patterns associated with highly integrated semiconductor devices have recently been developed, and thus fabricating costs have increased. This fabricating cost increase is a main reason for a productivity decrease of semiconductor devices. Accordingly, it is necessary to provide a structure of a semiconductor device and a method of its fabrication that can increase the productivity of the semiconductor device while reducing its fabrication costs.

SUMMARY

To solve the aforementioned problems, some embodiments of the present invention provide a NAND-type flash memory device having a simplified interconnection structure.

Some embodiments of the present invention also provide a method of fabricating a NAND-type flash memory device having a simplified interconnection structure.

According to an aspect of the present invention, a NAND-type flash memory device has a simplified interconnection structure. The NAND-type flash memory device may include a semiconductor substrate having a cell array region and a peripheral circuit region. In this embodiment, cell active regions and a peripheral active region are defined in the cell array region and the peripheral circuit region by a device isolation layer, respectively, and the cell active regions are parallel to one another. A string selection line, a ground selection line, and word lines, which traverse the cell active regions in parallel, are disposed. The word lines are located between the string selection line and the ground selection line. A peripheral gate pattern which traverses the peripheral active region is disposed. A lower interlayer insulating layer is disposed on the semiconductor substrate having the string selection line, the word lines, the ground selection line, and the peripheral gate pattern. There are included bit line contact plugs which penetrate through the lower interlayer insulating layer of the cell array region and are electrically connected to the cell active regions adjacent to the string selection line and located on a first side of the word lines, and a common source line which is electrically connected to the cell active regions adjacent to the ground selection line and located on a second side opposite to the first side of the word lines. There are included a peripheral gate interconnection contact plug and peripheral metal interconnection contact plugs, which penetrate through the lower interlayer insulating layer of the peripheral circuit region and are electrically connected to the peripheral gate pattern and the peripheral active region adjacent to both sides of the peripheral gate pattern, respectively.

In some embodiments of the present invention, insulating spacers covering sidewalls of the string selection line, the word lines, the ground selection line, and the peripheral gate pattern may further be included.

In another embodiment, the bit line contact plugs, the common source line, the peripheral gate interconnection contact plug, and the peripheral metal interconnection contact plugs may be composed of the same conductive layer formed through a same process, and heights of upper surfaces of the bit line contact plugs, the common source line, the peripheral gate interconnection contact plug, and the peripheral metal interconnection contact plugs may be substantially equal to one another.

In another embodiment, the bit line contact plugs, the common source line, the peripheral gate interconnection contact plug, and the peripheral metal interconnection contact plugs may be a polysilicon layer, a tungsten layer, an aluminum layer, or a stacked layer including a polysilicon layer and a tungsten layer.

In another embodiment, an upper interlayer insulating layer disposed on the lower interlayer insulating layer and including via holes which expose a predetermined region of the common source line and upper surfaces of the peripheral gate interconnection contact plug and the peripheral metal interconnection contact plugs may further be included. Further, there may be included bit lines and a cell metal interconnection which are disposed on the upper interlayer insulating layer of the cell array region and electrically connected to the bit line contact plugs and the common source line through the via holes, respectively; and a peripheral gate interconnection and peripheral metal interconnections which are disposed on the upper interlayer insulating layer of the peripheral circuit region and electrically connected to the peripheral gate interconnection contact plug and the peripheral metal interconnection contact plugs through the via holes, respectively. In this case, the bit lines, the cell metal interconnection, the peripheral gate interconnection, and the peripheral metal interconnections may be composed of a same metal layer formed through a same process. Here, the bit lines, the cell metal interconnection, the peripheral gate interconnection, and the peripheral metal interconnections may be a tungsten layer, an aluminum layer, or a copper layer.

According to another aspect of the present invention, a method may be used to fabricate a NAND-type flash memory device having a simplified interconnection structure. This method includes preparing a semiconductor substrate having a cell array region and a peripheral circuit region. A device isolation layer defining a plurality of cell active regions, which are parallel to one another, and a peripheral active region in the semiconductor substrate is formed. On the semiconductor substrate having the device isolation layer, a plurality of word lines traversing the cell active regions which are parallel to one another and a string selection line and a ground selection line that are respectively located on opposite sides of the word lines are formed, and a peripheral gate pattern traversing the peripheral active region is formed. A lower interlayer insulating layer is formed on the semiconductor substrate having the string selection line, the word lines, the ground selection line, and the peripheral gate pattern. The lower interlayer insulating layer is patterned to form bit line contact holes that expose the cell active regions adjacent to the string selection line and are located on a first side of the word lines, and a common source line trench that exposes the cell active regions adjacent to the ground selection line located on a second side opposite to the first side of the word lines, and to form a peripheral gate interconnection contact hole and peripheral metal interconnection contact holes that expose the peripheral gate pattern and the peripheral active region, respectively. In the lower interlayer insulating layer, bit line contact plugs, a common source line, a peripheral gate interconnection contact plug, and peripheral metal interconnection contact plugs are simultaneously formed, which fill the bit line contact holes, the common source line trench, the peripheral gate interconnection contact hole, and the peripheral metal interconnection contact holes, respectively.

BRIEF DESCRIPTION OF THE DRAWINGS

The above and other features and advantages of the present invention will become more apparent by describing in detail exemplary embodiments with reference to the attached drawings in which:

FIG. 1 is a plan view of NAND-type flash memory devices according to some embodiments of the present invention;

DETAILED DESCRIPTION

Figure 2A:
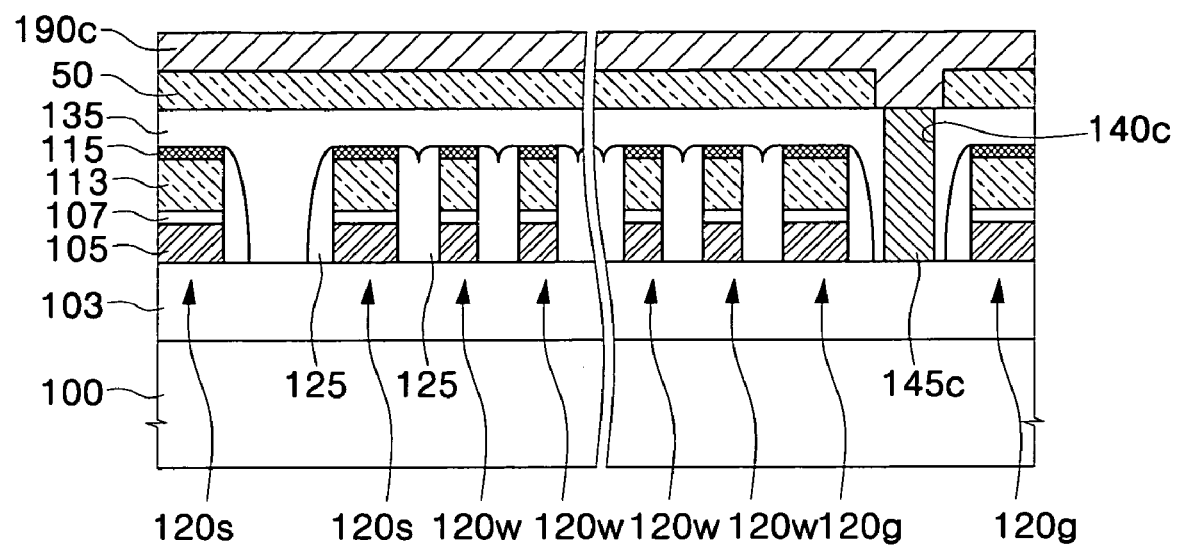
FIGS. 2A and 2B are cross-sectional views of the NAND-type flash memory devices according to the embodiments of the present invention.

To more specifically explain the present invention, exemplary embodiments of the present invention will be described in detail with reference to the attached drawings. However, the present invention is not limited to these exemplary embodiments but may be embodied in various forms. In the figures, if a layer is formed on another layer or a substrate, it means that the layer is directly formed on another layer or a substrate, or that a third layer is interposed therebetween. In the whole following description, the same reference numerals denote the same elements.

Figure 2B:
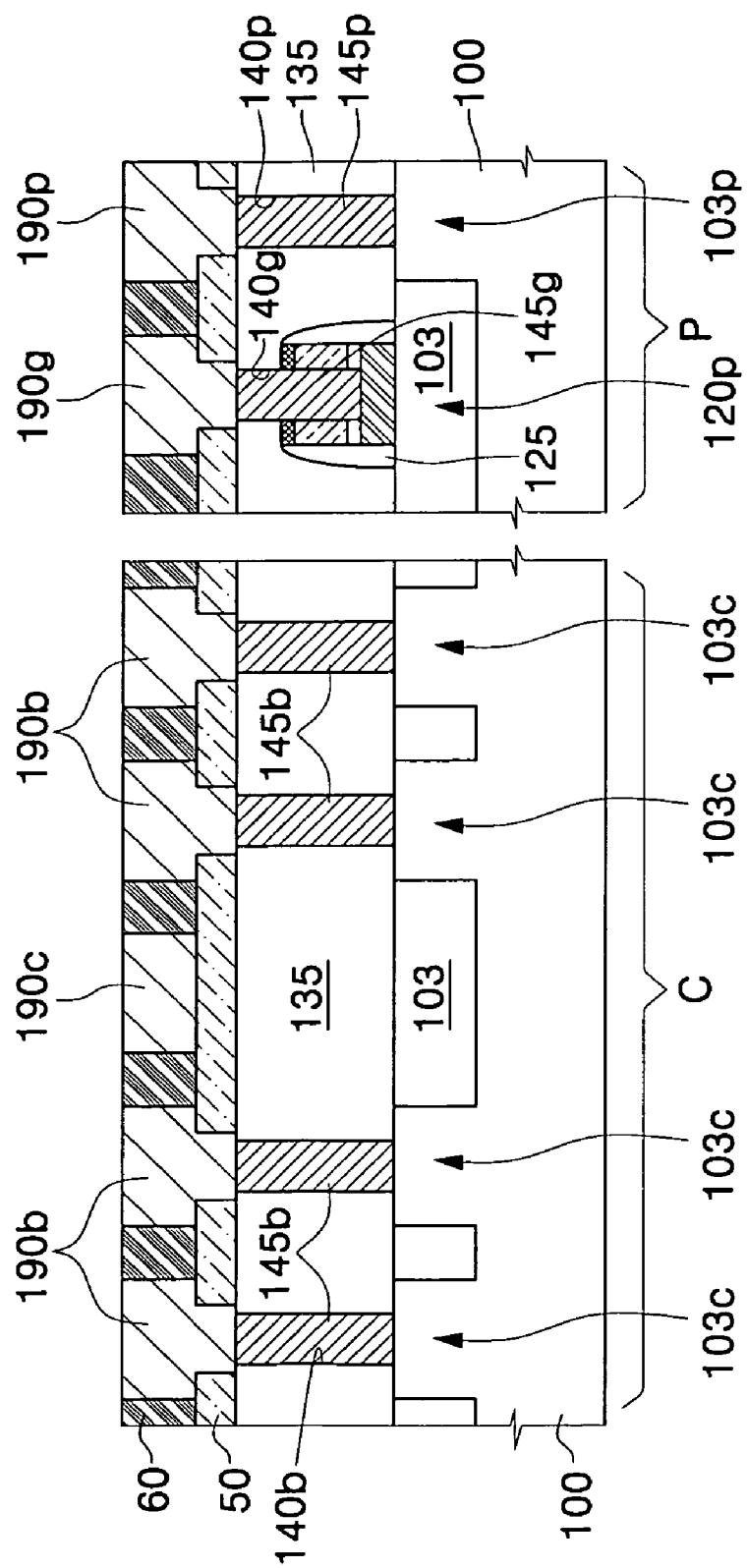

FIG. 1 is a plan view of NAND-type flash memory devices according to an embodiment of the present invention. FIGS. 2A and 2B are cross-sectional views of the NAND-type flash memory devices according to the embodiment of the present invention. FIG. 2A is a cross-sectional view taken along line I-I' shown in FIG. 1 and FIG. 2B is a cross-sectional view taken along line II-II', also shown in FIG. 1. In the figures, reference numeral "C" denotes a cell array region and reference numeral "P" denotes a peripheral circuit region.

Referring to FIGS. 1, 2A, and 2B, a semiconductor substrate 100 may have a cell array region C and a peripheral circuit region P. A device isolation layer 103 is provided in a predetermined region of the semiconductor substrate 100, and defines cell active regions 103c and a peripheral active region 103p in the cell array region C and the peripheral circuit region P, respectively. The cell active regions 103c may have the configuration of a plurality of parallel lines.

Gate patterns 120s, 120w, and 120g, which traverse the cell active region 103c and the device isolation layer 103, are disposed on the cell array region C of the semiconductor substrate 100. Also, a peripheral gate pattern 120p, which traverses the peripheral active region 103p, as shown in the right side of FIG. 1, and the device isolation layer 103, is disposed on the peripheral circuit region P of the semiconductor substrate 100. The gate patterns 120s, 120w, and 120g may be a stacked layer including a gate dielectric layer (not shown), a floating gate 105, an inter-gate dielectric layer 107, and a control gate 113. The floating gate 105 may be a polysilicon layer. The inter-gate dielectric layer 107 may be a high-k dielectric layer. For example, the inter-gate dielectric layer 107 may be a silicon oxide/silicon nitride/silicon oxide (ONO) layer. The control gate 113 may be a polysilicon layer or a stacked layer including a polysilicon layer and a metal silicide layer. In this case, the metal silicide layer may be a tungsten silicide layer, a cobalt silicide layer, or a nickel silicide layer, to list some examples.

The gate patterns 120s, 120w, and 120g disposed on the cell array region C of the semiconductor substrate 100 may be defined as a string selection line 120s, a word line 120w, and a ground selection line 120g, respectively. The gate patterns, which extend on the device isolation layer 103 and traverse the cell active regions 103 in the cell array region C of the semiconductor substrate 100, include a plurality of the word lines 120w, the string selection line 120s, and the ground selection line 120g, which are located on both sides of the word lines 120w. That is, the plurality of the word lines 120w are located between the string selection line 120s and the ground selection line 120g. The word lines 120w, the string selection line 120s, and the ground selection line 120g, which overlap the cell active regions 103c, may form cell transistors, a string selection transistor, and a ground selection transistor, using the cell active regions adjacent thereto as impurity regions, respectively. The cell active regions that are adjacent to the string selection line 120s and located on the opposite side of the ground selection line 120g may be defined as a drain region of the string selection transistor. Also, the cell active regions 103c that are adjacent to the ground selection line 120g and located on the opposite side of the string selection line 120s may be defined as a source region of the string selection transistor.

Furthermore, the peripheral gate pattern 120p, which overlaps the peripheral active region 103p of the peripheral circuit region P, and the peripheral active region 103p adjacent to both sides of the peripheral gate pattern 120p form a peripheral transistor. In this case, the peripheral transistor may be a PMOS or NMOS transistor. Impurity ions of a high concentration may be implanted into the peripheral active regions 103p adjacent to both sides of the peripheral gate pattern 120p. Capping layer patterns 115 for covering upper surfaces of the gate patterns 120s, 120w, 120g, and 120p may be additionally provided. The capping layer patterns 115 may include a silicon nitride layer. Insulating spacers 125 may cover sidewalls of the gate patterns 120s, 120w, 120g, and 120p. The insulating spacers 125 may include a silicon nitride layer, a silicon oxide layer, or a stacked layer of both, for example.

A lower interlayer insulating layer 135 is disposed on the semiconductor substrate 100 having the gate patterns 120s, 120w, 120g, and 120p. The lower interlayer insulating layer 135 includes contact holes 140b, 140c, 140g, and 140p to expose predetermined regions of the active regions 103c and 103p. In this case, the contact holes 140b, 140c, 140g, and 140p may be defined as a bit line contact hole 140b, a common source line trench 140c, a peripheral gate interconnection contact hole 140g, and a peripheral metal interconnection contact hole 140p, respectively.

More particularly, in the lower interlayer insulating layer 135 of the cell array region C, there are provided the bit line contact holes 140b, which expose the active regions that are adjacent to the string selection line 120s and located on the opposite side of the ground selection line 120g, and the common source line trench 140c, which expose the active regions that are adjacent to the ground selection line 120g and located on the opposite side of the string selection line 120s. Also, in the lower interlayer insulating layer 135 of the peripheral circuit region P, there are provided the peripheral gate interconnection contact hole 140g and the peripheral metal interconnection contact hole 140p, which expose the peripheral gate pattern 120p and the peripheral active region 103p, respectively. In this case, since the peripheral gate pattern 120p need not be divided into two layers like the floating gate 105 and the control gate 113 of the cell word lines 120w, the floating gate 105 may be exposed by the peripheral gate interconnection contact hole 140g. Also, since the string selection line 120s and the ground selection line 120g need not be divided into two layers like the floating gate 105 and the control gate 113, contact holes (not shown) for exposing the floating gate 105 may be provided like the peripheral gate pattern 120p.

A bit line contact plug 145b, a common source line 145c, a peripheral gate interconnection contact plug 145g, and peripheral metal interconnection contact plug 145p fill the bit line contact hole 140b, the common source line trench 140c, the peripheral gate interconnection contact hole 140g, and the peripheral metal interconnection contact holes 140p in the lower interlayer insulating layer 135, respectively. Upper surfaces of the bit line contact plug 145b, the common source line 145c, the peripheral gate interconnection contact plug 145g, and the peripheral metal interconnection contact plug 145p may be substantially coplanar with an upper surface of the lower interlayer insulating layer 135. Also, the bit line contact plug 145b, the common source line 145c, the peripheral gate interconnection contact plug 145g, and the peripheral metal interconnection contact plug 145p may be composed of the same conductive layer formed through the same process. The bit line contact plugs 145b, the common source line 145c, the peripheral gate interconnection contact plug 145g, and the peripheral metal interconnection contact plugs 145p may be a polysilicon layer, a tungsten layer, an aluminum layer, or a stacked layer including a polysilicon layer and a tungsten layer, for example. When they are formed of a tungsten layer, a titanium (Ti) layer and a titanium nitride (TiN) layer stacked in sequence may be provided below the tungsten layer.

An upper interlayer insulating layer 50 is disposed on the lower interlayer insulating layer 135. The upper interlayer insulating layer 50 may have bit line via holes 170b, a cell metal interconnection via hole 170c, a peripheral gate interconnection via hole 170g, and peripheral metal interconnection via holes 170p, which respectively expose the bit line contact plugs 145b, a predetermined region of the common source line 145c, the peripheral gate interconnection contact plug 145g, and the peripheral metal interconnection contact plugs 145p. The upper interlayer insulating layer 50 may be a silicon oxide layer, a silicon nitride layer, or a silicon oxynitride (SiON) layer. Bit lines 190b and a cell metal interconnection 190c, which are substantially parallel to each other and traverse the word lines 120w, the ground selection line 120g, and the string selection line 120s, are formed on the upper interlayer insulating layer 50 of the cell array region C. In this case, the bit lines 190b are electrically connected to the bit line contact plugs 145b through the bit line via holes 170b, respectively. The cell metal interconnection 190c is electrically connected to the predetermined region of the common source line 145c through the cell metal interconnection via hole 170c. In addition, a peripheral gate interconnection 190g and peripheral metal interconnections 190p are disposed on the upper interlayer insulating layer 50 of the peripheral circuit region P. The peripheral gate interconnection 190g is electrically connected to the peripheral gate interconnection contact plug 145g through the peripheral gate interconnection via hole 170g. Similarly, the peripheral metal interconnections 190p are electrically connected to the peripheral metal interconnection contact plugs 145p through the peripheral metal interconnection via holes 170p. The bit lines 190b, the cell metal interconnection 190c, the peripheral gate interconnection 190g, and the peripheral metal interconnections 190p may comprise a tungsten layer, an aluminum layer, or a copper layer. Further, an inter-metal insulating layer 60 may fill spaces between the bit lines 190b, the cell metal interconnection 190c, the peripheral gate interconnection 190g, and the peripheral metal interconnections 190p. The inter-metal insulating layer 60 may be, for example, a silicon oxide layer.

The bit lines 190b, the cell metal interconnection 190c, the peripheral gate interconnection 190g, and the peripheral metal interconnections 190p may be the same metal layer formed through the same process. The bit lines 190b, the cell metal interconnection 190c, the peripheral gate interconnection 190g, and the peripheral metal interconnections 190p may be directly connected to the bit line contact plugs 145b, the predetermined region of the common source line 145c, the peripheral gate interconnection contact plug 145g, and the peripheral metal interconnection contact plugs 145p through the bit line via holes 170b, the cell metal interconnection via hole 170c, the peripheral gate interconnection via hole 170g, and the peripheral metal interconnection via holes 170p, respectively.

As described above, the bit line contact plugs 145b, the common source line 145c, the peripheral gate interconnection contact plug 145g, and the peripheral metal interconnection contact plugs 145p in the NAND-type flash memory device may comprise the same conductive layer formed through the same process. Also, the bit lines 190b, the cell metal interconnection 190c, the peripheral gate interconnection 190g, and the peripheral metal interconnections 190p comprise the same metal layer formed through the same process. Accordingly, the structure of the NAND-type flash memory device can be simplified.

FIGS. 3A through 6B are cross-sectional views illustrating a method of fabricating a NAND-type flash memory device according to an embodiment of the present invention. FIGS. 3A, 4A, 5A, and 6A are cross-sectional views taken along line I-I' shown in FIG. 1, and FIGS. 3B, 4B, 5B, and 6B are cross-sectional views taken along line II-II' shown in FIG. 1.

Figure 3A:
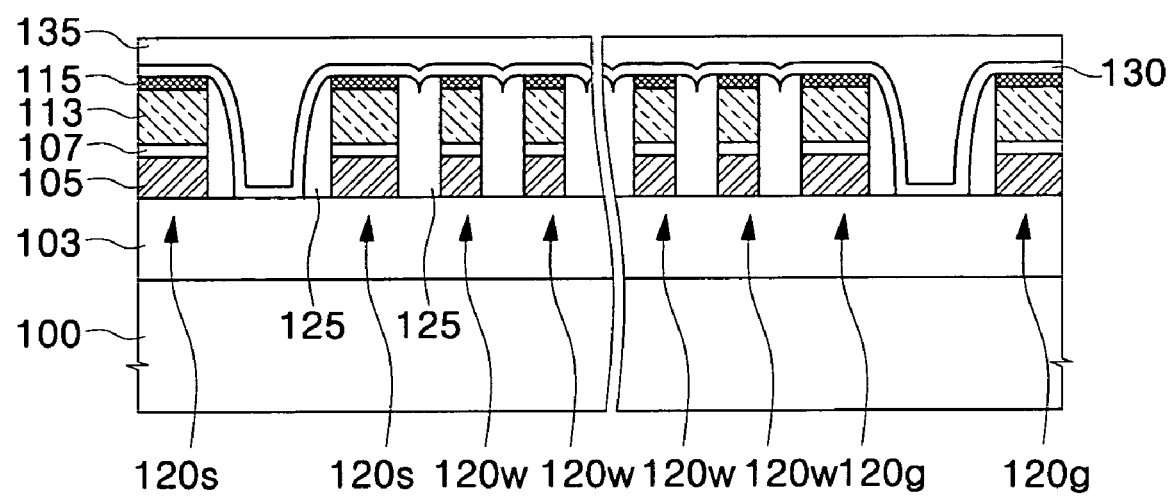
FIGS. 3A through 6B are cross-sectional views illustrating a method of fabricating a NAND-type flash memory device according to an embodiment of the present invention.
Figure 3B:
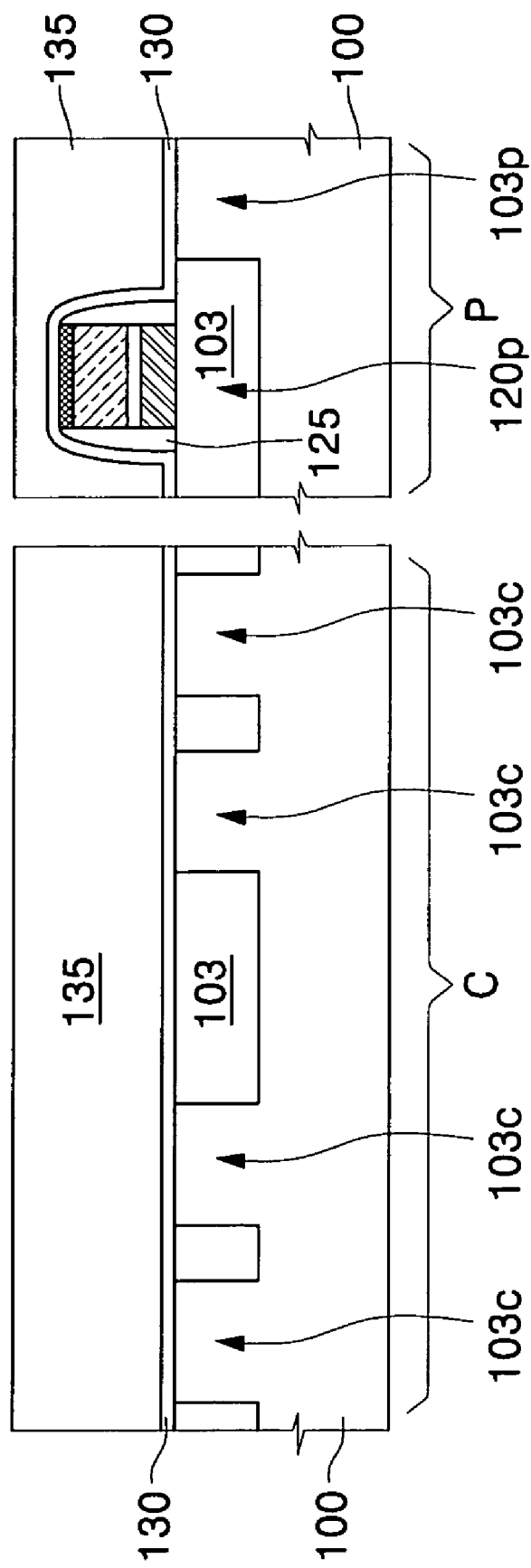

Referring to FIGS. 1, 3A, and 3B, a semiconductor substrate 100 including a cell array region C and a peripheral circuit region P is prepared. A device isolation layer 103 is formed in the semiconductor substrate 100 to define a plurality of cell active regions 103c and a peripheral active region 103p. The cell active regions 103c may have a line shape. The device isolation layer 103 may be formed using a shallow trench isolation (STI) method.

Gate patterns 120s, 120w, 120g, and 120p are formed on the semiconductor substrate 100 having the active regions 103c and 103p. In this case, the gate patterns 120s, 120w, 120g, and 120p may include a floating gate 105, an inter-gate dielectric layer 107, and a control gate 113, which are sequentially stacked. A gate dielectric layer (not shown) is formed between the floating gate 105 and the active regions 103c and 103p. The floating gate 105 may be formed of a polysilicon layer. The inter-gate dielectric layer 107 may be formed of a high-k dielectric layer. For example, the inter-gate dielectric layer 107 may be an ONO layer. The control gate 113 may be formed of a polysilicon layer or a stacked layer including a polysilicon layer and a metal silicide layer. In this case, the metal silicide layer may be a tungsten silicide layer, a cobalt silicide layer, or a nickel silicide layer. Capping layer patterns 115 may further be formed on the gate patterns 120s, 120w, 120g, and 120p. The capping layer patterns 115 may be formed of a silicon nitride layer, for example.

The gate patterns 120s, 120w, 120g, and 120p may be defined as word lines 120w, a string selection line 120s, a ground selection line 120g, and a peripheral gate pattern 120p, respectively. More particularly, the word lines 120w, the string selection line 120s, and the ground selection line 120g, which are substantially parallel to one another and traverse the cell active regions 103c, and the peripheral gate pattern 120p, which traverses the peripheral active region 103p, may be simultaneously formed. In this case, the plurality of the word lines 120w are located between the string selection line 120s and the ground selection line 120g.

Insulating spacers 125, which cover sidewalls of the string selection line 120s, the word lines 120w, the ground selection line 120g, and the peripheral gate patterns 120p may be formed. The insulating spacer 125 may be formed of a silicon oxide layer, a silicon nitride layer, or a combination of these layers, for example.

The word lines 120w, the string selection line 120s, and the ground selection line 120g, which overlap the cell active region 103c, may form cell transistors, a string selection transistor, and a ground selection transistor using the adjacent cell active regions 103c as impurity regions, respectively. The cell active regions 103c, which are adjacent to the string selection line 120s and located on the opposite side of the ground selection line 120g, may be defined as a drain region of the string selection transistor. The cell active regions 103c, which are adjacent to the ground selection line 120g and located on the opposite side of the string selection line 120s, may be defined as a source region of the string selection transistor. Also, the peripheral gate pattern 120p, which overlaps the peripheral active region 103p of the peripheral circuit region P and the peripheral active region 103p adjacent to both sides of the peripheral gate pattern 120p, form a peripheral transistor. In this case, the peripheral transistor may be a PMOS or NMOS transistor.

Impurity ions are implanted into the cell active region 103c and the peripheral active region 103p. For example, before forming the insulating spacers 125, the impurity ions, with a low concentration, are implanted into the cell active region 103c and the peripheral active region 103p using the gate patterns 120s, 120w, 120g, and 120p as an ion implantation mask. Then, after forming the insulating spacers 125, impurity ions with a high concentration are implanted. In this case, when the impurity region that forms the peripheral transistor in the peripheral circuit region P has a conductive type different from that of the impurity regions forming the transistors in the cell array region C, different impurity ions can be implanted into the peripheral active region 103p, using a photoresist layer together with the device isolation layer 103 and the peripheral gate pattern 120p as an ion implantation mask.

In this embodiment, a lower interlayer insulating layer 135 is formed on the semiconductor substrate 100. The lower interlayer insulating layer 135 may be formed of a silicon oxide layer. Before forming the lower interlayer insulating layer 135, a conformal passivation layer 130 with an etching selectivity for the lower interlayer insulating layer 135 may be additionally formed. For example, when the lower interlayer insulating layer 135 is formed of a silicon oxide layer, the passivation layer 130 may be formed of a silicon nitride layer or a silicon oxynitride (SiON) layer. The passivation layer 130 can prevent the semiconductor substrate 100 from being damaged due to a subsequent process of patterning the lower interlayer insulating layer 135, for example.

The lower interlayer insulating layer 135 may be planarized using, for example, a chemical mechanical polishing (CMP) method. The lower interlayer insulating layer 135 may be planarized so that an upper surface of the passivation layer located on the gate patterns 120s, 120w, 120g, and 120p is exposed. The lower interlayer insulating layer 135 may also be planarized to a thickness of approximately 1500 Å or less from the upper surface of the passivation layer located on the gate patterns 120s, 120w, 120g, and 120p.

Figure 4A:
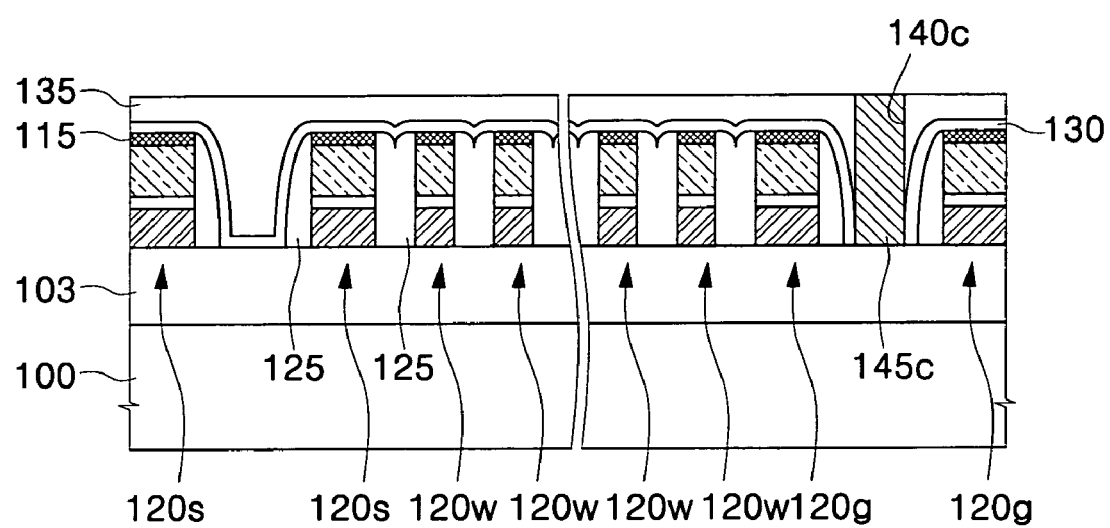
Figure 4B:
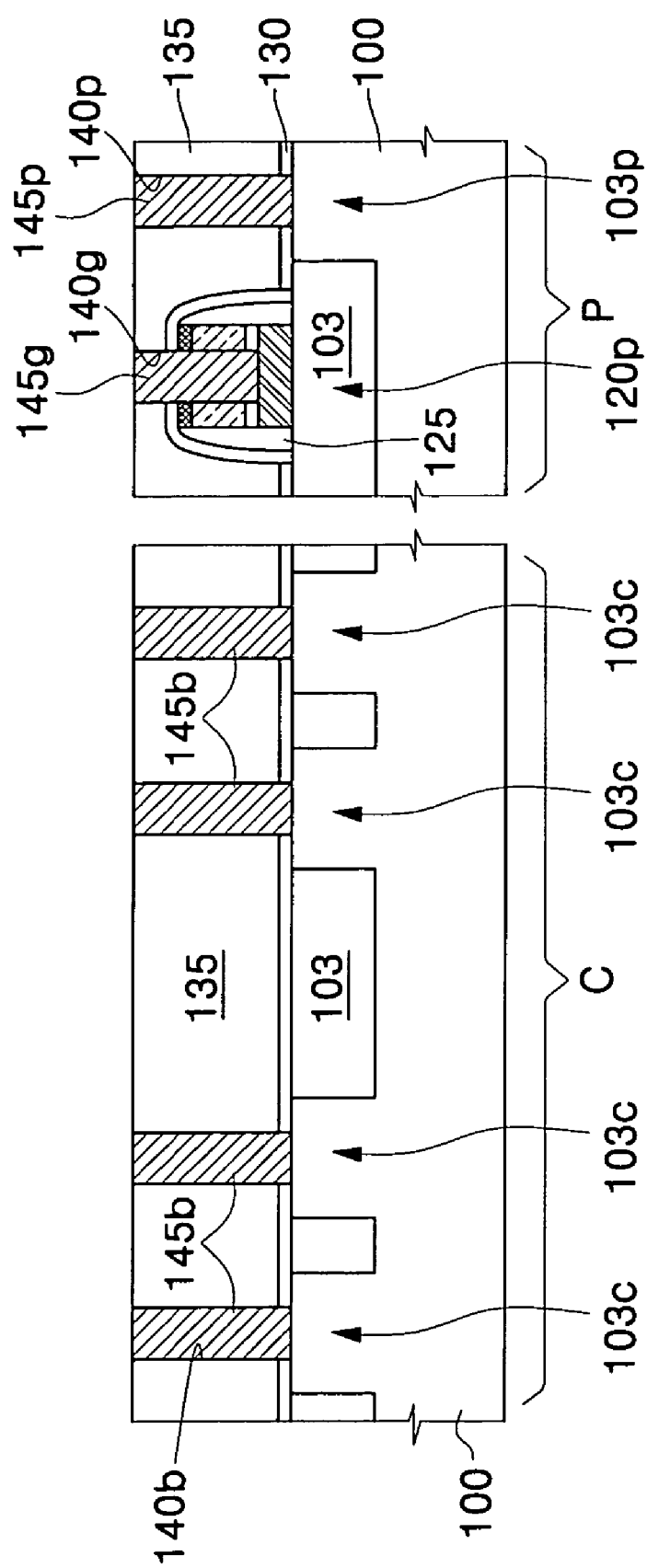

Referring to FIGS. 1, 4A, and 4B, the lower interlayer insulating layer 135 is patterned to form contact holes 140b, 140c, 140g, and 140p to expose predetermined regions of the active regions. The contact holes 140b, 140c, 140g, and 140$p$ may be defined as bit line contact holes 140$b$, a common source line trench 140$c$, a peripheral gate interconnection contact hole 140$g$, and peripheral interconnection contact holes 140$p$, respectively.

More particularly, the lower interlayer insulating layer 135 of the cell array region C is patterned to form the bit line contact holes 140$b$, which expose the active regions adjacent to the string selection line 120$s$ and located on the opposite side of the ground selection line 120$g$, and the common source line trench 140$c$, which exposes the active regions adjacent to the ground selection line 120$g$ and located on the opposite side of the string selection line 120$s$. Simultaneously, the lower interlayer insulating layer 135 of the peripheral circuit region P is patterned to form the peripheral gate interconnection contact hole 140$g$, which exposes a predetermined region of the peripheral gate pattern 120$p$, and the peripheral metal interconnection contact holes 140$p$, which expose the active region located on both sides of the peripheral gate pattern 120$p$.

On the other hand, since the peripheral gate pattern 120$p$ need not include two layers like the floating gate 105 and the control gate 113 of the cell word lines 120$w$, the floating gate 105 of the peripheral gate pattern 120$p$ may be exposed using a general butting process. That is, the floating gate of the peripheral gate pattern 120$p$ may be exposed by the peripheral gate interconnection contact hole 140$g$. Also, since the string selection line 120$s$ and the ground selection line 120$g$ need not be divided into two layers like the floating gate and the control gate, contact holes (not shown) for exposing the floating gate of the string selection line 120$s$ and the ground selection line 120$g$ may be provided through the butting process.

Subsequently, impurity ions may be implanted into the active regions exposed by the contact holes 140$b$, 140$c$, 140$g$, and 140$p$ to improve contact resistance.

Subsequently, contact plugs 145$b$, 145$c$, 145$g$, and 145$p$ are formed to fill the contact holes 140$b$, 140$c$, 140$g$, and 140$p$. In detail, a conductive layer for filling the bit line contact holes 140$b$, the common source line trench 140$c$, the peripheral gate interconnection contact hole 140$g$, and the peripheral metal interconnection contact holes 140$p$ is formed on the lower interlayer insulating layer 135. The conductive layer is planarized to expose an upper surface of the lower interlayer insulating layer 135 to simultaneously form the bit line contact plugs 145$b$, the common source line 145$c$, the peripheral gate interconnection contact plug 145$g$, and the peripheral metal interconnection contact plugs 145$p$, which fill the bit line contact holes 140$b$, the common source line trench 140$c$, the peripheral gate interconnection contact hole 140$g$, and the peripheral metal interconnection contact holes 140$p$, respectively. As the result, upper surfaces of the bit line contact plugs 145$b$, the common source line 145$c$, the peripheral gate interconnection contact plug 145$g$, and the peripheral metal interconnection contact plugs 145$p$ can be located on substantially the same plane. The bit line contact plugs 145$b$, the common source line 145$c$, the peripheral gate interconnection contact plug 145$g$, and the peripheral metal interconnection contact plugs 145$p$ may be formed of a polysilicon layer, a tungsten layer, an aluminum layer, or a stacked layer including a polysilicon layer and a tungsten layer, for example. The planarization process may be performed using an etch-back method or a CMP method.

Figure 5A:
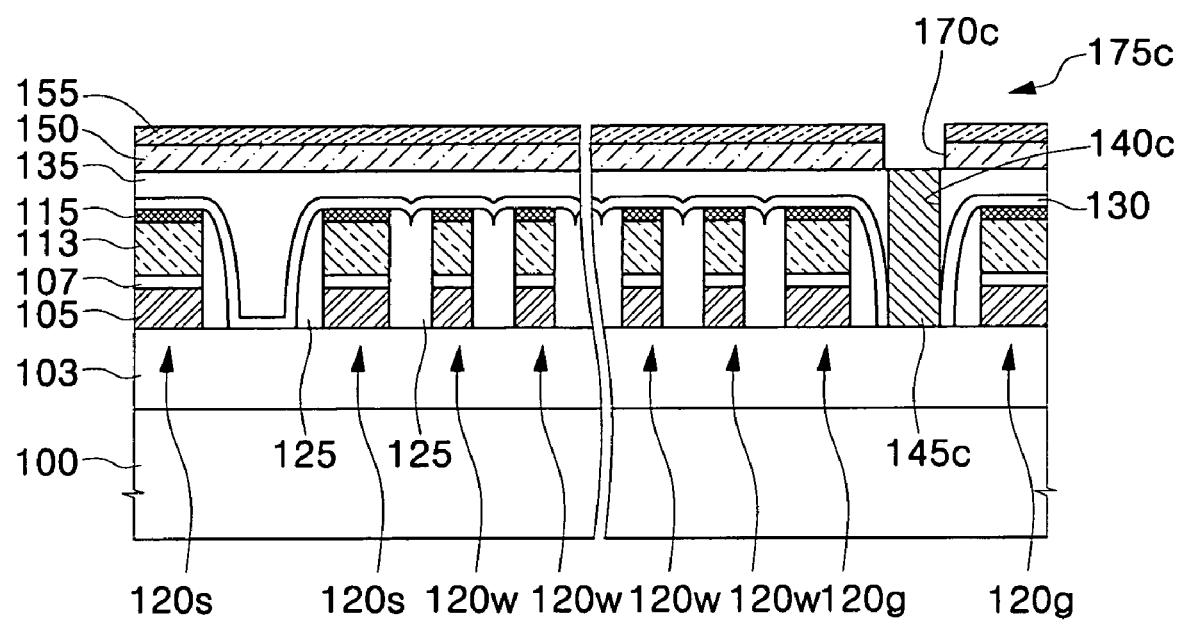
Figure 5B:
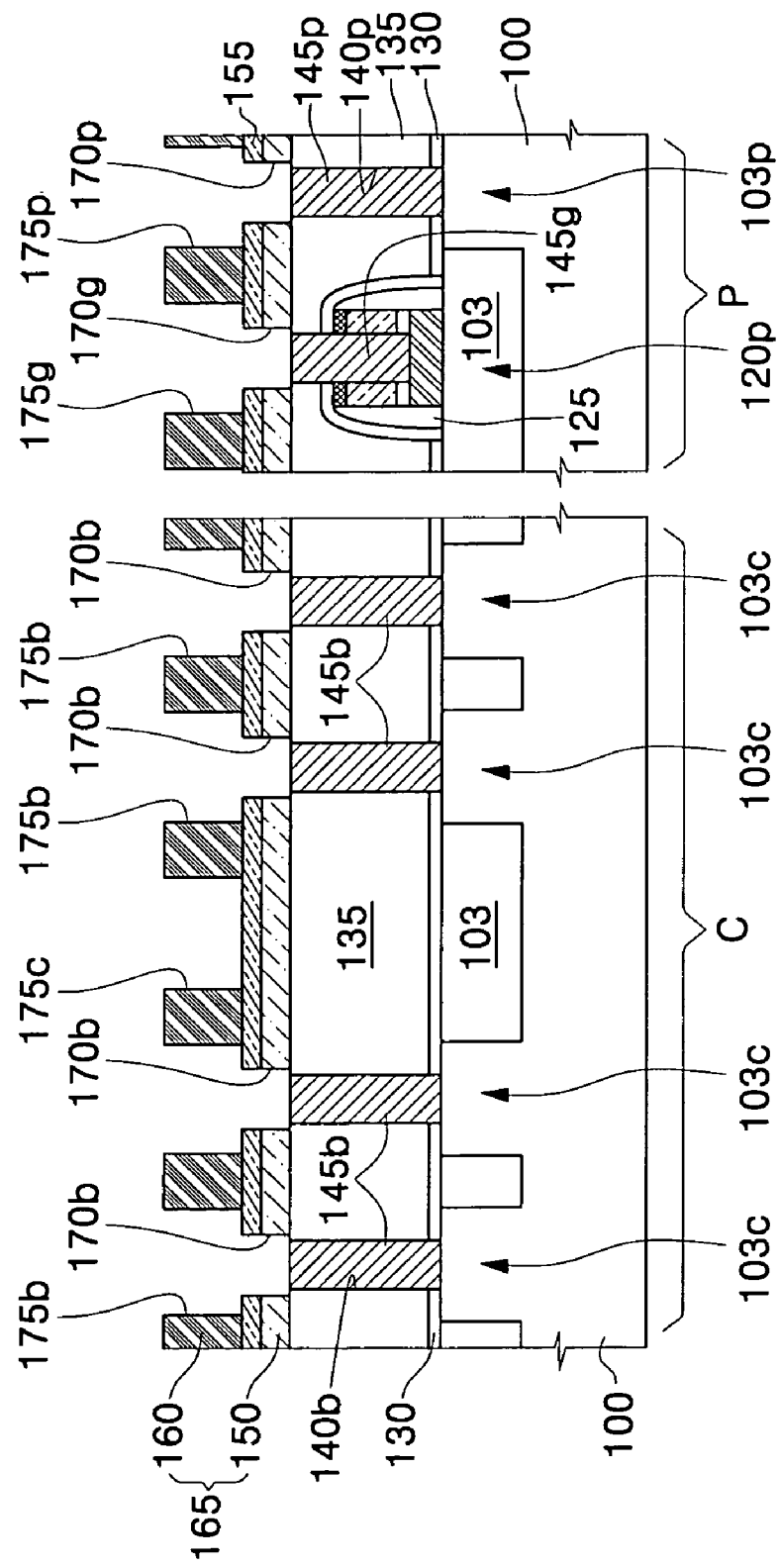

Referring to FIGS. 1, 5A, and 5B, an upper insulating layer 165 is formed on the semiconductor substrate 100. The upper insulating layer 165 may be formed of an upper interlayer insulating layer 150, an etch stop layer 155, and an inter-metal insulating layer 160, which are sequentially stacked. Preferably, the etch stop layer 155 is formed of an insulating layer having etching selectivity with respect to the inter-metal insulating layer 160 and the upper interlayer insulating layer 150. For example, when the inter-metal insulating layer 160 and the upper interlayer insulating layer 150 are formed of a silicon oxide layer, the etch stop layer 155 may be formed of a silicon nitride layer or a silicon oxynitride layer.

The inter-metal insulating layer 160, the etch stop layer 155, and the upper interlayer insulating layer 150 are sequentially patterned to form bit line via holes 170$b$, a cell metal interconnection via hole 170$c$, a peripheral gate interconnection via hole 170$g$, and peripheral metal interconnection via holes 170$p$, which expose the bit line contact plugs 145$b$, a predetermined region of the common source line 145$c$, the peripheral gate interconnection contact plug 145$g$, and the peripheral metal interconnection contact plugs 145$p$, respectively.

Subsequently, the inter-metal insulating layer 160 is selectively patterned to form bit line trenches 175$b$, a cell metal interconnection trench 175$c$, peripheral gate interconnection trenches 175$g$, and peripheral metal interconnection trenches 175$p$, which overlap the bit line via holes 170$b$, the cell metal interconnection via hole 170$c$, the peripheral gate interconnection via hole 170$g$, and the peripheral metal interconnection via holes 170$p$, respectively.

Alternatively, the trenches 175$b$, 175$c$, 175$g$, and 175$p$ may be formed before the via holes 170$b$, 170$c$, 170$g$, and 170$p$. Specifically, the inter-metal insulating layer 160 may be selectively patterned to form the trenches 175$b$, 175$c$, 175$g$, and 175$p$. Subsequently, the etch stop layer 155 and the upper interlayer insulating layer 150 exposed by the trenches 175$b$, 175$c$, 175$g$, and 175$p$ may be sequentially patterned to form via holes 170$b$, 170$c$, 170$g$, and 170$p$ which expose the bit line contact plugs 145$b$, the predetermined region of the common source line 145$c$, the peripheral gate interconnection contact plug 145$g$, and the peripheral metal interconnection contact plugs 145$p$, respectively.

Figure 6A:
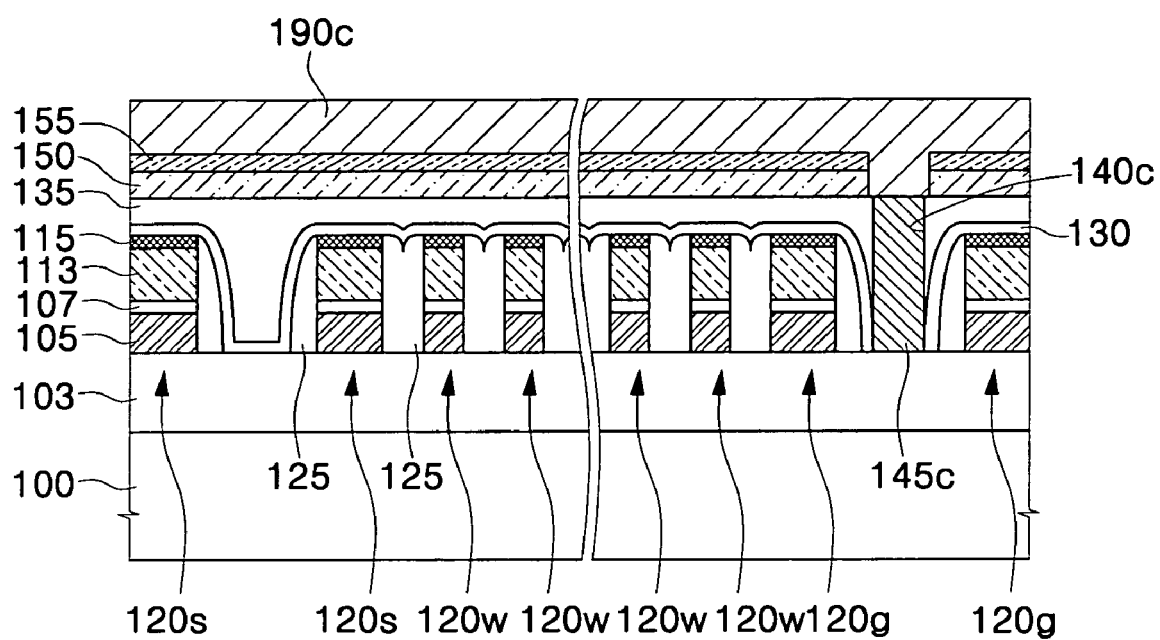
Figure 6B:
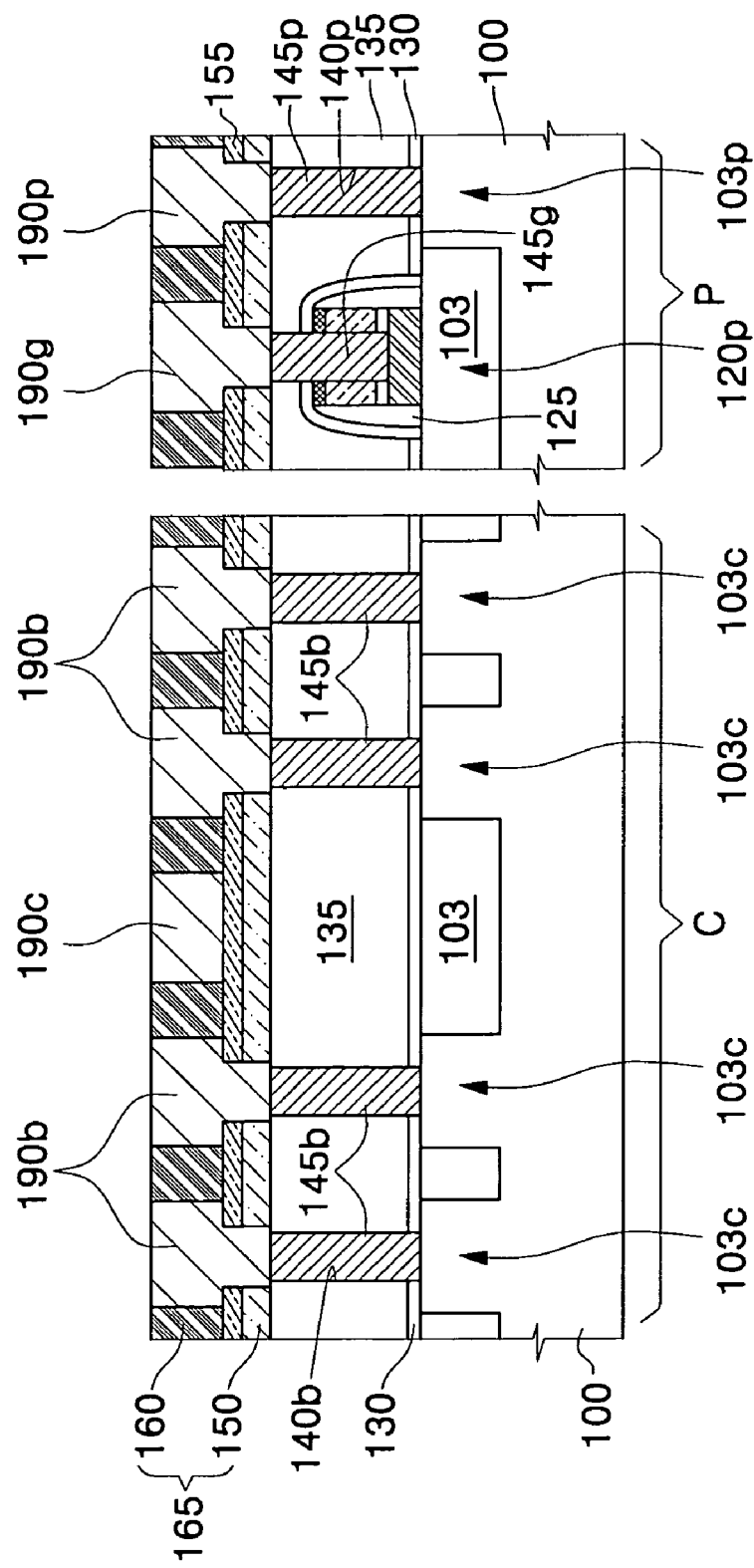

Referring to FIGS. 1, 6A, and 6B, a metal layer for filling the via holes 170$b$, 170$c$, 170$g$, and 170$p$ and the trenches 175$b$, 175$c$, 175$g$, and 175$p$ may be formed on the inter-metal insulating layer 160. The metal layer may be formed of tungsten, aluminum, or copper, for example. Subsequently, a planarization process for exposing an upper surface of the inter-metal insulating layer 160 may be performed. As a result, bit lines 190$b$ for filling the bit line via holes 170$b$ and the bit line trenches 175$b$; a cell metal interconnection 190$c$ for filling the cell metal interconnection via hole 170$c$ and the cell metal interconnection trench 175$c$; a peripheral gate interconnection 190$g$ for filling the peripheral gate interconnection via hole 170$g$ and the peripheral gate interconnection trench 175$g$; and peripheral metal interconnections 190$p$ for filling the peripheral metal interconnection via holes 170$p$ and the peripheral metal interconnection trenches 175$p$ may be simultaneously formed. Accordingly, the bit lines 190$b$, the cell metal interconnection 190$c$, the peripheral gate interconnection 190$g$, and the peripheral metal interconnections 190$p$ may be electrically connected to the bit line contact plugs 145$b$, the predetermined region of the common source line 145$c$, the peripheral gate interconnection contact plug 145$g$, and the peripheral metal interconnection contact plugs 145$p$, respectively.

Figure 7A:
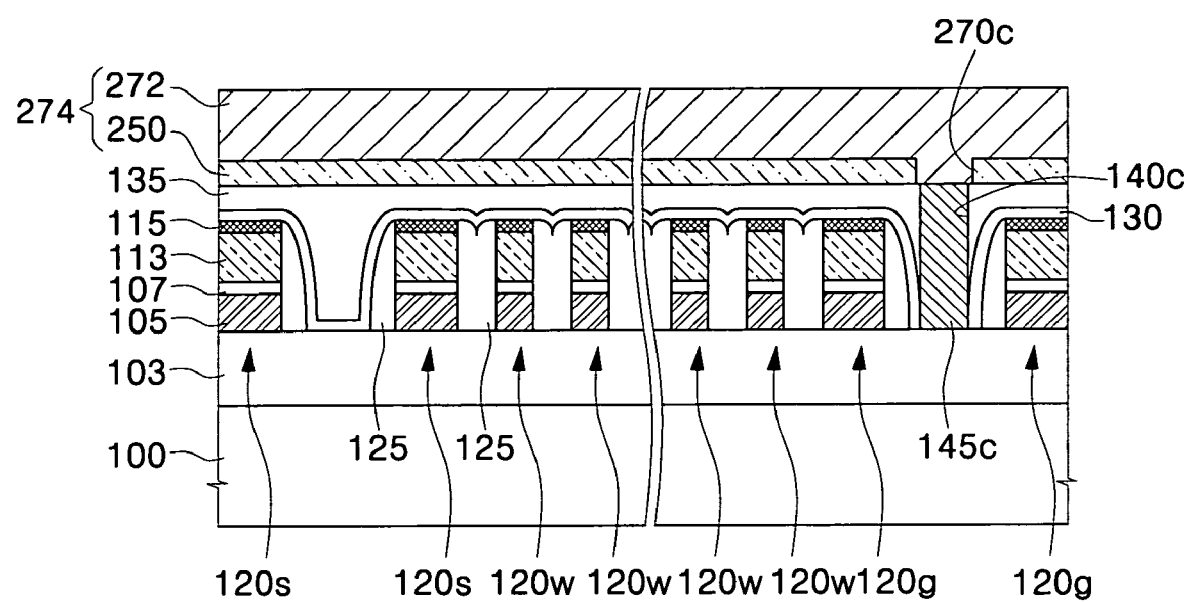
FIGS. 7A through 8B are cross-sectional views illustrating a method of fabricating a NAND-type flash memory device according to another embodiment of the present invention.
Figure 7B:
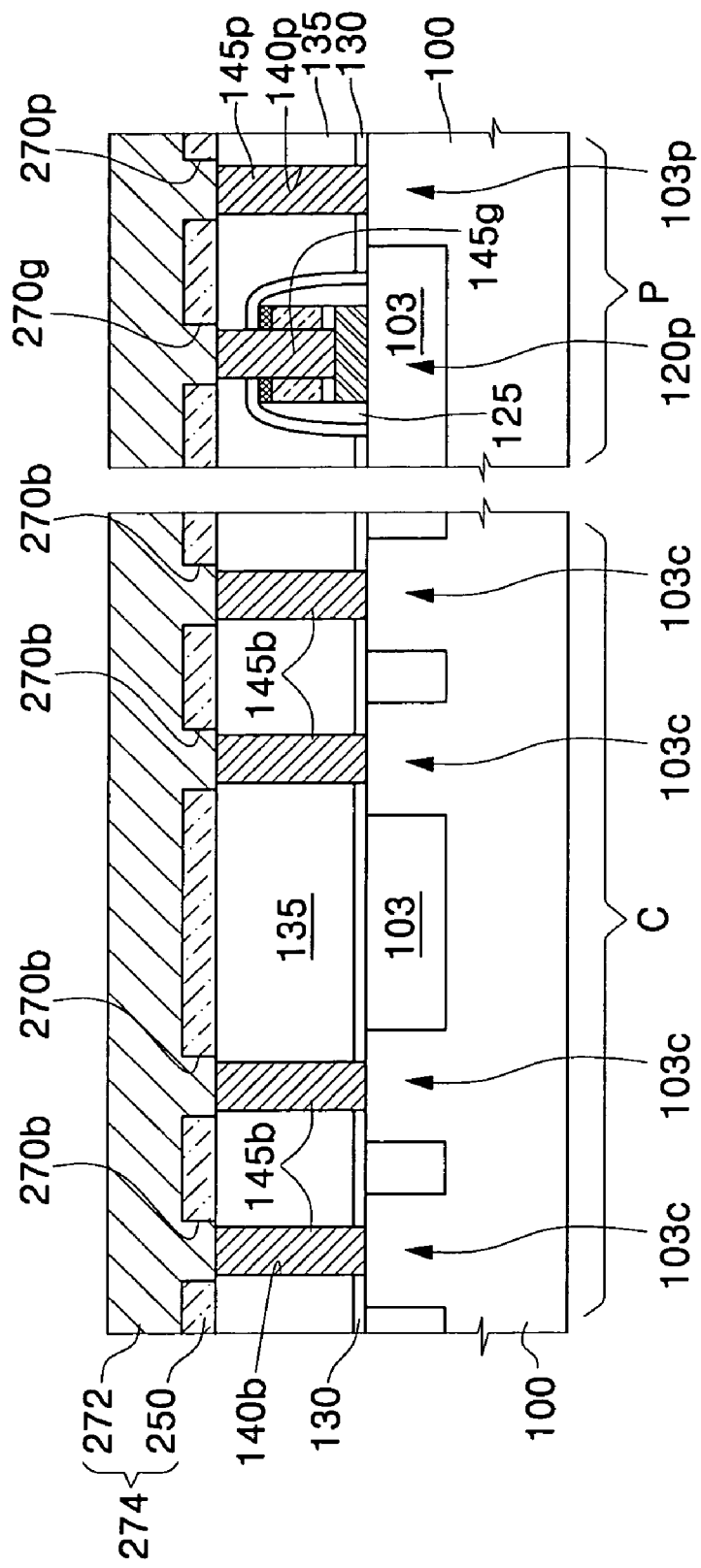
Figure 8A:
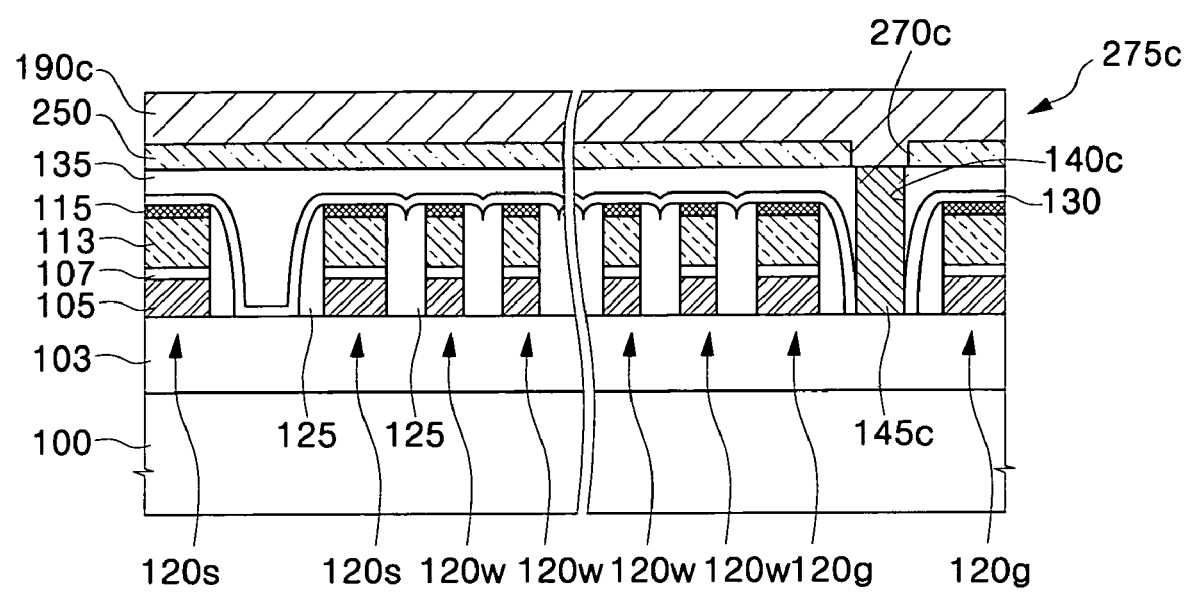
Figure 8B:
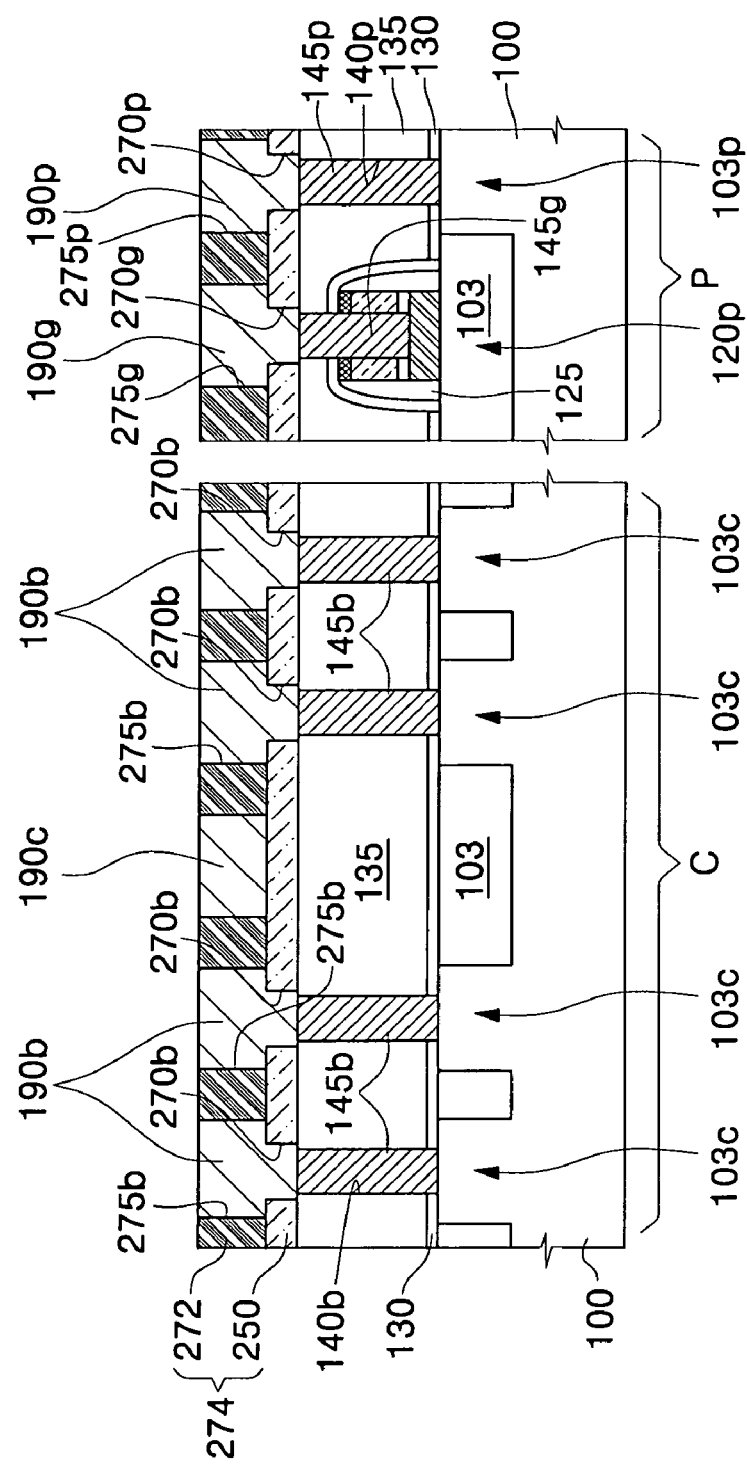

FIGS. 7A through 8B are cross-sectional views illustrating a method of fabricating a NAND-type flash memory device according to another embodiment of the present invention. FIGS. 7A and 8A are cross-sectional views taken along line I-I' shown in FIG. 1, and FIGS. 7B and 8B are cross-section views taken along line II-II' shown in FIG. 1. Since the process of forming the bit line contact plugs 145b, the common source line 145c, the peripheral gate interconnection contact plug 145g, and the peripheral metal interconnection contact plugs 145p is the same as those described with reference to FIGS. 3A through 4B, the process of forming the process of forming the bit line contact plugs 145b, the common source line 145c, the peripheral gate interconnection contact plug 145g, and the peripheral metal interconnection contact plugs 145p will not be described for the sake of simplicity.

Referring to FIGS. 1, 7A, and 7B, an upper interlayer insulating layer 250 is formed on the semiconductor substrate 100 having the bit line contact plugs 145b, the common source line 145c, the peripheral gate interconnection contact plug 145g, and the peripheral metal interconnection contact plugs 145p. The upper interlayer insulating layer 250 may be formed of an insulating layer having etching selectivity with respect to a lower interlayer insulating layer 135. For example, when the lower interlayer insulating layer 135 is formed of a silicon oxide layer, the upper interlayer insulating layer 250 may be formed of a silicon nitride layer.

Subsequently, the upper interlayer insulating layer 250 is patterned to form bit line via holes 270b, a cell metal interconnection via hole 270c, a peripheral gate interconnection via hole 270g, and peripheral metal interconnection via holes 270p, which respectively expose the bit line contact plugs 145b, a predetermined region of the common source line 145c, the peripheral gate interconnection contact plug 145g, and the peripheral metal interconnection contact plugs 145p.

Subsequently, an inter-metal insulating layer 272 having etching selectivity with respect to the upper interlayer insulating layer 250 is formed on the upper interlayer insulating layer 250. For example, when the upper interlayer insulating layer 250 is formed of a silicon nitride layer, the inter-metal insulating layer 272 may be formed of a silicon oxide layer. Here, the upper interlayer insulating layer 250 and the inter-metal insulating layer 272 may form an upper insulating layer 274.

Referring to FIGS. 1, 8A, and 8B, the inter-metal insulating layer 272 is patterned to form bit line trenches 275b, a cell metal interconnection trench 275c, a peripheral gate interconnection trench 275g, and peripheral metal interconnection trenches 275p, which overlap the bit line via holes 270b, the cell metal interconnection via hole 270c, the peripheral gate interconnection via hole 270g, and the peripheral metal interconnection via holes 270p, respectively. In this case, the bit line contact plugs 145b, the predetermined region of the common source line 145c, the peripheral gate interconnection contact plug 145g, and the peripheral metal interconnection contact plugs 145p are exposed while forming the trenches 275b, 275c, 275g, and 275p, respectively.

Subsequently, a metal layer for filling the via holes 270b, 270c, 270g, and 270p and the trenches 275b, 275c, 275g, and 275p is formed on the upper interlayer insulating layer 250. The metal layer may be formed of tungsten, aluminum, or copper. Subsequently, the metal layer is planarized to expose an upper surface of the upper interlayer insulating layer 250. As a result, bit lines 190b, a cell metal interconnection 190c, a peripheral gate interconnection 190g, and peripheral metal interconnections 190p are formed. The bit lines 190b, the cell metal interconnection 190c, the peripheral gate interconnection 190g, and the peripheral metal interconnections 190p are coupled to the bit line contact plugs 145b, the common source line 145c, the peripheral gate interconnection contact plug 145g, and the peripheral metal interconnection contact plugs 145p, respectively.

Figure 9A:
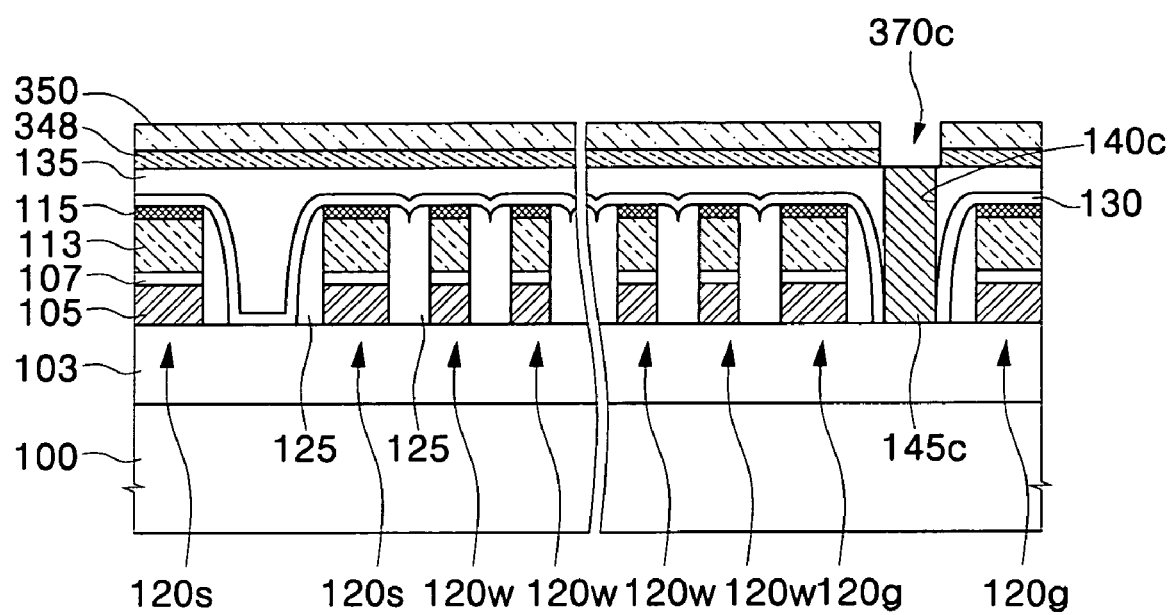
FIGS. 9A through 10B are cross-sectional views illustrating a method of fabricating a NAND-type flash memory device according to yet another embodiment of the present invention.
Figure 9B:
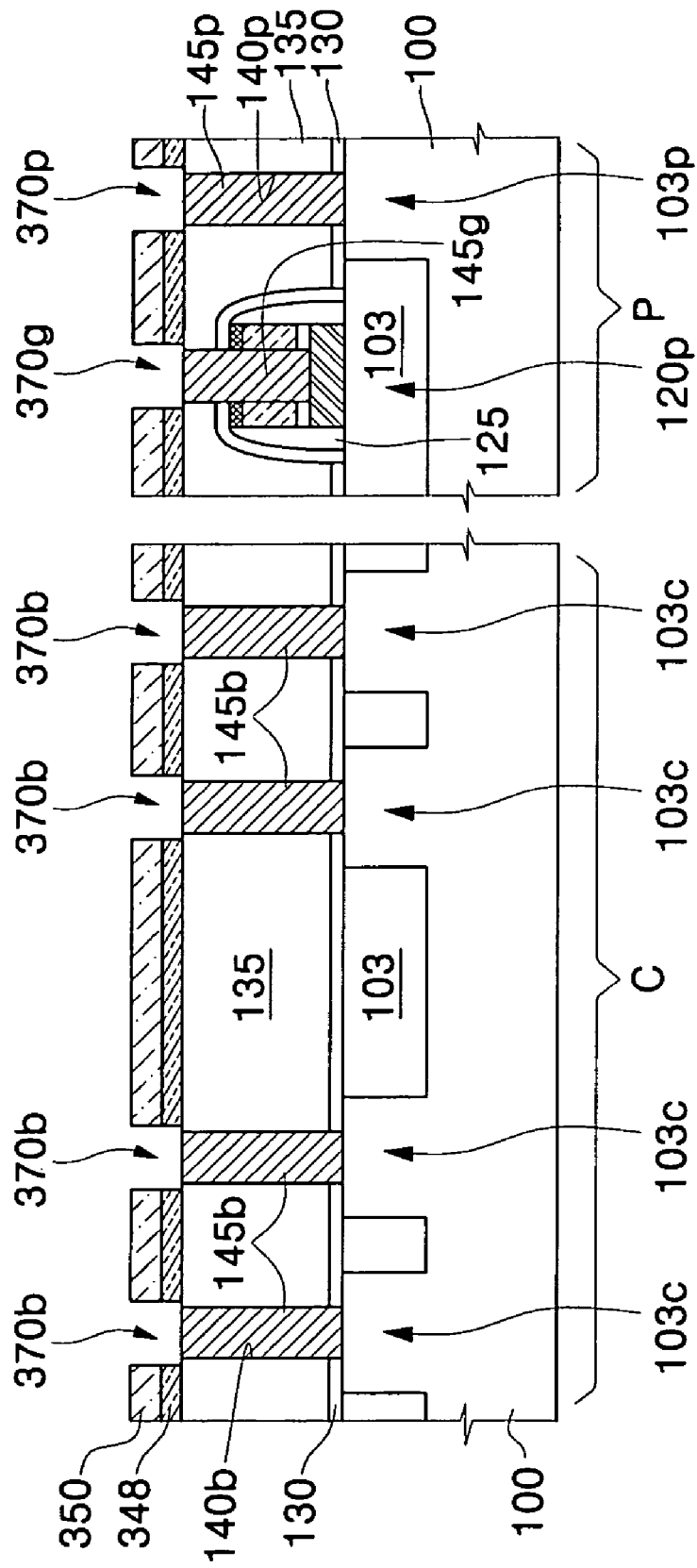
Figure 10A:
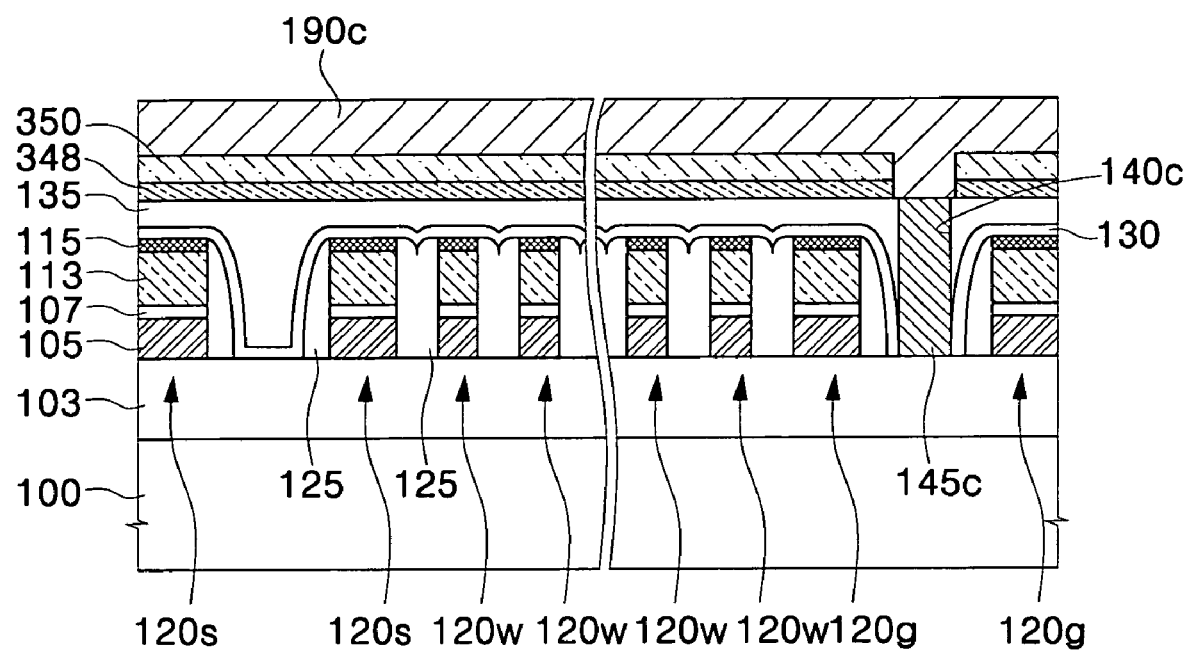
Figure 10B:
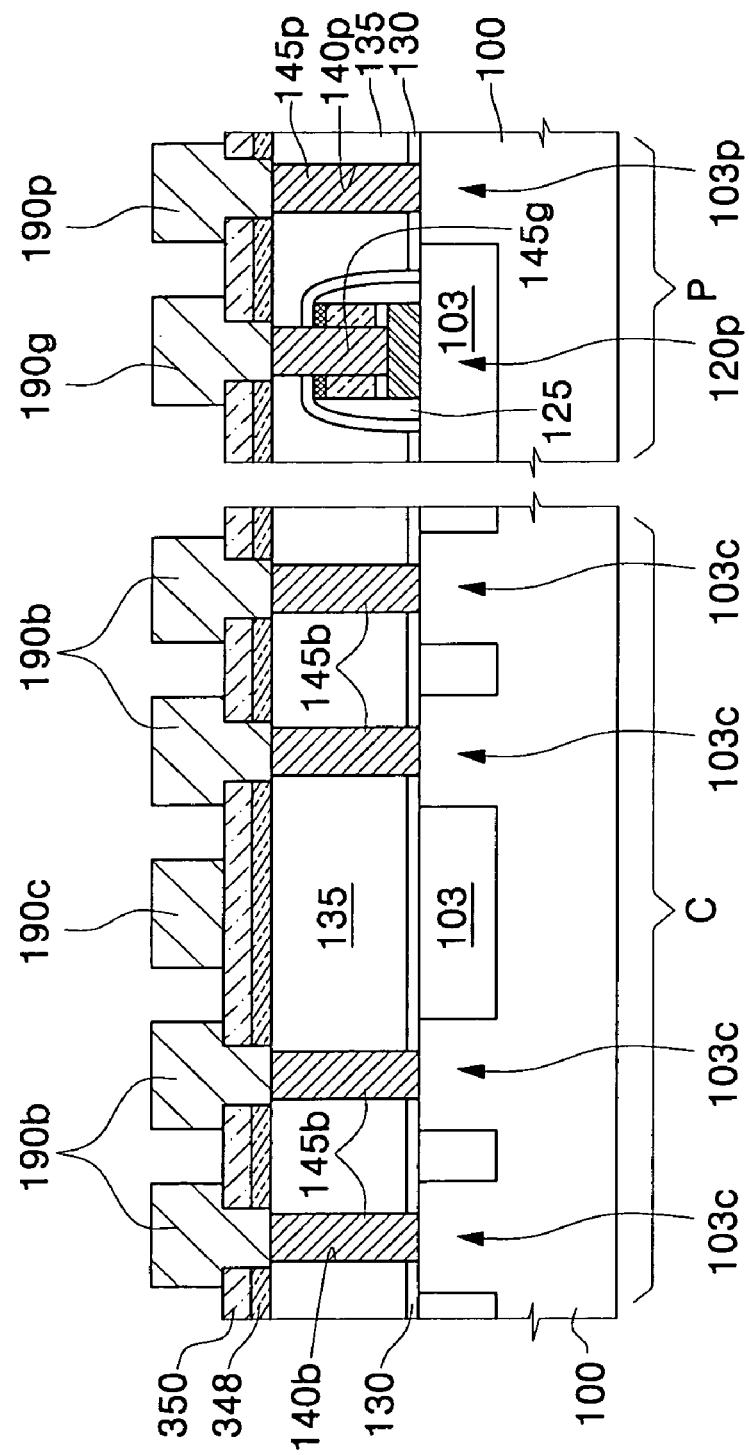

FIGS. 9A through 10B are cross-sectional views illustrating a method of fabricating a NAND-type flash memory device according to yet another embodiment of the present invention. FIGS. 9A and 10A are cross-sectional views taken along line I-I' shown in FIG. 1, and FIGS. 9B and 10B are cross-section views taken along line II-II' shown in FIG. 1. Since the process of forming the bit line contact plugs 145b, the common source line 145c, the peripheral gate interconnection contact plug 145g, and the peripheral metal interconnection contact plugs 145p is the same as those described with reference to FIGS. 3A through 4B, the process of forming the process of forming the bit line contact plugs 145b, the common source line 145c, the peripheral gate interconnection contact plug 145g, and the peripheral metal interconnection contact plugs 145p will not be described.

Referring to FIGS. 1, 9A, and 9B, an upper interlayer insulating layer 350 is formed on the semiconductor substrate having the bit line contact plugs 145b, the common source line 145c, the peripheral gate interconnection contact plug 145g, and the peripheral metal interconnection contact plugs 145p. The upper interlayer insulating layer 350 may be formed of a silicon oxide layer. Here, before forming the upper interlayer insulating layer 350, an etch stop layer 348 may be formed. Preferably, the etch stop layer 348 is formed of an insulating layer having etching selectivity with respect to the lower interlayer insulating layer 135. For example, when the lower interlayer insulating layer 135 is formed of a silicon oxide layer, the etch stop layer 348 may be formed of a silicon nitride layer or a silicon oxynitride layer. The formation of the etch stop layer 348 may be omitted.

Subsequently, the upper interlayer insulating layer 350 and the etch stop layer 348 are patterned to form bit line via holes 370b, a cell metal interconnection via hole 370c, a peripheral gate interconnection via hole 370g, and peripheral metal interconnection via holes 370p which expose the bit line contact plugs 145b, a predetermined region of the common source line 145c, the peripheral gate interconnection contact plug 145g, and the peripheral metal interconnection contact plugs 145p, respectively.

Referring to FIGS. 1, 10A, and 10B, a metal layer for filling the bit line via holes 370b, the cell metal interconnection via hole 370c, the peripheral gate interconnection via hole 370g, and the peripheral metal interconnection via holes 370p may be formed on the upper interlayer insulating layer 350. The metal layer may be formed of tungsten or aluminum. Subsequently, the metal layer is subjected to a planarization process to form, on the upper interlayer insulating layer 350 of the cell array region C, bit lines 190b, and a cell metal interconnection 190c, which are substantially parallel to each other and overlap the bit line via holes 370b and the cell metal interconnection via hole 370c, respectively. Also formed on the upper interlayer insulating layer 350 of the peripheral circuit region P are a peripheral gate interconnection 190g and peripheral metal interconnections 190p, which overlap the peripheral gate interconnection via hole 370g and the peripheral metal interconnection via holes 370p. The bit lines 190b, the cell metal interconnection 190c, the peripheral gate interconnection 190g, and the peripheral metal interconnections 190p are directly electrically connected to the bit line contact plugs 145b, the common source line 145c, the peripheral gate interconnection contact plug 145g, and the peripheral metal interconnection contact plugs 145p, respectively.

As a result, the plugs including the bit line contact plugs 145*b*, the common source line 145*c*, the peripheral gate interconnection contact plug 145*g*, and the peripheral metal interconnection contact plugs 145*p* in the cell array region C and the peripheral circuit region P are formed of the same conductive layer through the same process. Also, the metal interconnections including the bit lines 190*b*, the cell metal interconnection 190*c*, the peripheral gate interconnection 190*g*, and the peripheral metal interconnections 190*p* directly connected to the plugs in the cell array region C and the peripheral circuit region P are formed of the same metal layer through the same process. Accordingly, the interconnection structure such as the plugs and the metal interconnections is simplified and thus the process of their formation is simplified. That is, the process is simplified compared with a conventional process.

As described above, according to some embodiments of the present invention, the plugs including the bit line contact plugs, the common source line, the peripheral gate interconnection contact plug, and the peripheral metal interconnection contact plugs in the cell array region and the peripheral circuit region comprise the same conductive layer formed through the same process. Also, the metal interconnections including the bit lines, the cell metal interconnection, the peripheral gate interconnection, and the peripheral metal interconnections, which may be directly connected to the plugs, are composed of the same conductive layer formed through the same process. Further, the bit lines, the cell metal interconnection, the peripheral gate interconnection, and the peripheral metal interconnections are directly connected to the bit line contact plugs, the common source line, the peripheral gate interconnection contact plug, and the peripheral metal interconnection contact plugs. As a result, the interconnection structure such as the plugs and the metal interconnection is simplified and thus the process of their formation is simplified. That is, the process is simplified compared with a conventional process, and thus the fabricating costs are reduced and productivity increases.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a memory device comprising:
   introducing a semiconductor substrate having a cell array region and a peripheral circuit region;
   forming a device isolation layer to define cell active regions and a peripheral active region in the semiconductor substrate;
   forming, on the semiconductor substrate having the device isolation layer, word lines that traverse the cell active regions; a string selection line and a ground selection line that are on opposite sides of the word lines, respectively; and a peripheral gate pattern that traverses the peripheral active region;
   forming a lower interlayer insulating layer on the semiconductor substrate having the string selection line, the word lines, the ground selection line, and the peripheral gate pattern;
   patterning the lower interlayer insulating layer to form bit line contact holes that expose the cell active regions adjacent to the string selection line located on a first side of the word lines, to form a common source line trench that exposes the cell active regions adjacent to the ground selection line located on a second side opposite to the first side of the word lines, and to form a peripheral gate interconnection contact hole and peripheral metal interconnection contact holes that expose the peripheral gate pattern and the peripheral active region, respectively; and
   simultaneously forming, in the lower interlayer insulating layer, bit line contact plugs, a common source line, a peripheral gate interconnection contact plug, and peripheral metal interconnection contact plugs, which fill the bit line contact holes, the common source line trench, the peripheral gate interconnection contact hole, and the peripheral metal interconnection contact holes, respectively.

2. The method according to claim 1, which further comprises forming insulating spacers to cover sidewalls of the word lines, the string selection line, the ground selection line, and the peripheral gate pattern.

3. A method of fabricating a memory device comprising:
   introducing a semiconductor substrate having a cell array region and a peripheral circuit region;
   forming a device isolation layer to define cell active regions and a peripheral active region in the semiconductor substrate;
   forming, on the semiconductor substrate having the device isolation layer, word lines that traverse the cell active regions; a string selection line and a ground selection line that are on opposite sides of the word lines, respectively; and a peripheral gate pattern that traverses the peripheral active region;
   forming a lower interlayer insulating layer on the semiconductor substrate having the string selection line, the word lines, the ground selection line, and the peripheral gate pattern;
   patterning the lower interlayer insulating layer to form bit line contact holes that expose the cell active regions adjacent to the string selection line located on a first side of the word lines, to form a common source line trench that exposes the cell active regions adjacent to the ground selection line located on a second side opposite to the first side of the word lines, and to form a peripheral gate interconnection contact hole and peripheral metal interconnection contact holes that expose the peripheral gate pattern and the peripheral active region, respectively;
   simultaneously forming, in the lower interlayer insulating layer, bit line contact plugs, a common source line, a peripheral gate interconnection contact plug, and peripheral metal interconnection contact plugs, which fill the bit line contact holes, the common source line trench, the peripheral gate interconnection contact hole, and the peripheral metal interconnection contact holes, respectively; and
   before forming the lower interlayer insulating layer, forming a conformal passivation layer on the semiconductor substrate having the word lines, the string selection line, the ground selection line, and the peripheral gate pattern.

4. The method according to claim 3, wherein the passivation layer comprises a silicon nitride layer or a silicon oxynitride (SiON) layer.

5. The method according to claim 1, which further comprises planarizing the lower interlayer insulating layer.

6. The method according to claim 1, wherein the bit line contact plugs, the common source line, the peripheral gate interconnection contact plug, and the peripheral metal interconnection contact plugs are formed of a polysilicon layer, or a tungsten layer, or an aluminum layer, or a stacked layer that includes a polysilicon layer and a tungsten layer.

7. The method according to claim 1, further comprising:
forming an upper insulating layer on the semiconductor substrate having the bit line contact plugs, the common source line, the peripheral gate interconnection contact plug, and the peripheral metal interconnection contact plugs;
forming via holes that expose the bit line contact plugs, the common source line, the peripheral gate interconnection contact plug, and the peripheral metal interconnection contact plugs; and
forming trenches that traverse the via holes.

8. The method according to claim 7, wherein the upper insulating layer includes an upper interlayer insulating layer, an etch stop layer, and an inter-metal insulating layer stacked in sequence, and the etch stop layer comprises an insulating layer having an etching selectivity with respect to the upper interlayer insulating layer and the inter-metal insulating layer.

9. The method according to claim 8, wherein the upper interlayer insulating layer and the inter-metal insulating layer each comprise a silicon oxide layer, and the etch stop layer comprises a silicon nitride layer or a silicon oxynitride layer.

10. The method according to claim 8, wherein forming the via holes and the trenches comprises:
sequentially patterning the upper interlayer insulating layer, the etch stop layer, and the inter-metal insulating layer; and
selectively patterning the upper interlayer insulating layer to form the trenches.

11. The method according to claim 8, wherein forming the via holes and the trenches comprises:
selectively patterning the upper interlayer insulating layer to form the trenches; and
sequentially patterning the upper interlayer insulating layer, the etch stop layer, and the inter-metal insulating layer to form the via holes.

12. The method according to claim 7, wherein the upper insulating layer includes an upper interlayer insulating layer and an inter-metal insulating layer stacked in sequence, and the upper interlayer insulating layer comprises an insulating layer having etching selectivity with respect to the inter-metal insulating layer.

13. The method according to claim 12, wherein forming the via holes and the trenches comprises:
forming the upper interlayer insulating layer on the lower interlayer insulating layer;
patterning the upper interlayer insulating layer to form the via holes;
forming the inter-metal insulating layer on the upper interlayer insulating layer; and
patterning the inter-metal insulating layer to form the trenches.

14. The method according to claim 12, wherein the upper interlayer insulating layer comprises a silicon nitride layer or a silicon oxynitride layer, and the inter-metal insulating layer comprises a silicon oxide layer.

15. The method according to claim 7, which further comprises forming bit lines, a cell metal interconnection, a peripheral gate interconnection, and peripheral metal interconnections that respectively fill the via holes and the trenches in the upper insulating layer and are electrically connected to the bit line contact plugs, the common source line, the peripheral gate interconnection contact plug, and the peripheral metal interconnection contact plugs.

16. The method according to claim 15, wherein the bit lines, the cell metal interconnection, the peripheral gate interconnection, and the peripheral metal interconnections each comprise a tungsten layer, an aluminum layer, or a copper layer.

17. A method of fabricating a memory device comprising:
introducing a semiconductor substrate having a cell array region and a peripheral circuit region;
forming a device isolation layer to define cell active regions and a peripheral active region in the cell array region and the peripheral circuit region, respectively;
forming word lines that traverse the cell active regions; a string selection line and a ground selection line that are on opposite sides of the word lines, respectively; and a peripheral gate pattern that traverses the peripheral active region;
forming a lower interlayer insulating layer on the semiconductor substrate;
patterning the lower interlayer insulating layer to form bit line contact holes that expose the cell active regions adjacent to the string selection line located on a first side of the word lines, to form a common source line trench that exposes the cell active regions adjacent to the ground selection line located on a second side opposite to the first side of the word lines, and to form a peripheral gate interconnection contact hole and peripheral metal interconnection contact holes that expose the peripheral gate pattern and the peripheral active region, respectively;
simultaneously forming, in the lower interlayer insulating layer, bit line contact plugs, a common source line, a peripheral gate interconnection contact plug, and peripheral metal interconnection contact plugs, which fill the bit line contact holes, the common source line trench, the peripheral gate interconnection contact hole, and the peripheral metal interconnection contact holes, respectively; and
forming an upper interlayer insulating layer having via holes that expose the bit line contact plugs, the common source line, the peripheral gate interconnection contact plug, and the peripheral metal interconnection contact plugs.

18. The method according to claim 17, further comprising:
forming a metal layer on the upper interlayer insulating layer; and
patterning the metal layer to traverse the via holes to form bit lines, a cell metal interconnection, a peripheral gate interconnection, and peripheral metal interconnections that are electrically connected to the bit line contact plugs, the common source line, the peripheral gate interconnection contact plug, and the peripheral metal interconnection contact plugs, respectively.

19. The method according to claim 13, wherein forming the inter-metal insulating layer includes forming the inter-metal insulating layer on the upper interlayer insulating layer having the via holes formed therein.

* * * * *